United States Patent [19]

Cioffi et al.

[11] Patent Number: 5,406,226

[45] Date of Patent: Apr. 11, 1995

[54] STABLE, NARROW BANDWIDTH, HIGH FREQUENCY AMPLIFIER WITH LOW POWER CONSUMPTION

[75] Inventors: Kenneth R. Cioffi; Cynthia C. Robinson, both of San Jose; Russell P. Prosynchak, Sunnyvale, all of Calif.

[73] Assignee: Wireless Access, Inc., Santa Clara, Calif.

[21] Appl. No.: 88,137

[22] Filed: Jul. 7, 1993

[51] Int. Cl.$^6$ .................. H03F 3/193; H03F 1/34; H03F 3/191
[52] U.S. Cl. .................. 330/306; 330/286; 330/302; 330/303
[58] Field of Search ............... 330/286, 302, 303, 306, 330/326

[56] References Cited

U.S. PATENT DOCUMENTS 4,975,658  8/1990  Takayama .................. 330/306
5,146,178  9/1992  Nojima et al. .................. 330/306

OTHER PUBLICATIONS

Cioffi, Kenneth R., "Monolithic L Band Amplifiers Operating at Milliwatt and Sub-Milliwatt DC Power Consumptions", *IEEE 1992 Microwave and Millimeter-Wave Monolithic Circuits Symposium*, pp. 9–12.
Cioffi, Kenneth R., "Ultra-Low DC Power Consumptions in Monolithic L-Band Components", *IEEE Transactions on Microwave Theory and Techniques*, vol. 40, No. 12, Dec. 1992, pp. 2467–2472.
Imai and Tokumitsu, et al., "Very Low-Current and Small-Size GaAs MMICs for L-Band Front-End Applications", *IEEE GaAs IC Symposium*, 1989, pp. 71–74.
Imai and Tokumitsu, et al., "Design and Performance of Low-Current GaAs MMIC's for Low-Band Front-End Applications", *IEEE Transactions on Microwave Theory and Techniques*, vol. 39, No. 2, Feb. 1991, pp. 209–214.
Nair, Vijay, "Low Current Enhancement Mode MMIC's for Portable Communication Applications", *IEEE GaAs IC Symposium*, 1989, pp. 67–70.
Takeuchi, Hiroshi, et al., "A Si Wide-Band MMIC Amplifier Family for L-S Band Consumer Product Applications", *IEEE MTT-S Digest*, 1991, pp. 1283–1284.

*Primary Examiner*—William L. Sikes
*Assistant Examiner*—Fetsum Abraham
*Attorney, Agent, or Firm*—Blakely, Sokoloff, Taylor & Zafman

[57] ABSTRACT

A low noise narrow band amplifier with low power consumption for amplifying radio frequency and microwave signals. The amplifier includes a high frequency transistor that has a cut-off frequency greater than the center frequency of the input signal. The amplifier includes an emitter inductor for low noise and better input match. The amplifier is stabilized for out-of-band high frequency oscillations by a collector inductor and a base inductor. The amplifier is further stabilized unconditionally for out-of-band high frequency oscillations by a stabilizing circuit coupled between the output and ground, including a stabilizing capacitor in series with a stabilizing resistor.

38 Claims, 3 Drawing Sheets

STABLE, NARROW BANDWIDTH, HIGH FREQUENCY AMPLIFIER WITH LOW POWER CONSUMPTION

BACKGROUND OF THE INVENTION

1. Field of the Invention

The present invention relates to low noise narrowband amplifiers for amplifying a radio frequency or microwave signal. Particularly, the invention relates to amplifiers for wireless communication receivers that consume low power.

2. Description of Related Art

Minimization of DC power consumption is useful for prolonging battery life in portable high frequency (i.e., RF and microwave) electronics such as communication receivers. Examples of wireless communication applications that have receivers comprising battery-powered amplifiers include paging, wireless LANs, wireless messaging, wireless modems, cellular telephony, navigation systems, wireless control systems, and wireless security. In such applications, communication receivers may include an antenna to provide the high frequency signals to an amplifier "front-end". However, high frequency signals may be supplied from many different sources, for example by a direct link such as a coaxial cable. A typical high frequency narrowband signal is defined by a center frequency and a narrow band of surrounding frequencies (the "passband"). An advantage of narrow passband is that a narrowband amplifier can be used, which reduces the filter requirements of the system, thereby increasing performance of the overall system and reducing cost.

Lower DC power consumption by an amplifier allows reduction in the size and weight of the required batteries and increases the system operating time before battery replacement or recharge is necessary. Of a system's power consumption, conventional high frequency circuitry consumes a large portion, sometimes more than one-half of the total system power. If the power consumption could be reduced, then battery lifetime could be prolonged.

In addition to low power consumption, a high frequency amplifier should optimize the following qualities: low noise, a close input impedance match, a close output impedance match, high gain in the passband, and unconditional stability in the passband and all other frequencies at which oscillation is possible. Stability is a particularly difficult problem with high performance narrowband low noise amplifiers when operated at lower power consumptions. At higher power consumptions, stability would not be as significant a problem because device impedances usually render the device stable for most terminating impedances at frequencies above the passband. Stability at higher power is mainly due to reduced collector/base feedback capacitance in a bipolar junction transistor (BJT), and reduced drain/gate feedback capacitance in a Field Effect Transistor (FET).

The electrical components for a low DC power amplifier should include high frequency transistors designed for frequencies higher than the center frequency. Although more costly, these high frequency transistors are useful because a transistor's frequency characteristics are derated when operated with low DC power. However, high frequency transistors have disadvantages including a substantial tendency for instability at a wide range of frequencies, particularly frequencies which are more than twice the center frequency.

The noise figure and input match of a high frequency Field Effect Transistor (FET) amplifier with low power consumption can be improved by use of a source inductor coupled between the source and ground. This source inductor is a shunt feedback element. However, stability of the FET amplifier, particularly at high out-of-band frequencies, is a problem. If a Bipolar Junction Transistor (BJT) with an emitter inductor were used in place of the FET with the source inductor, the resulting amplifier would provide similar advantages including improvement in the noise figure and the input match. However, the instability problem is more severe in the BJT amplifier, because the characteristics of a high frequency BJT permit uncontrolled high frequency oscillations to more readily occur and render the amplifier unstable.

It would be an advantage to provide a circuit that can stabilize the high frequency oscillations that would otherwise cause instability in a BJT amplifier with an emitter inductor or a FET amplifier with a source inductor. Such a circuit would allow use of an emitter inductor to improve performance of low DC power consumption/low noise high frequency amplifiers that utilize high frequency bipolar transistors (BJTs). Such a technique could also improve the performance of amplifiers built with FETs.

SUMMARY OF THE INVENTION

An object of the present invention is to provide a low noise transistor amplifier with low power consumption.

The present invention provides a low noise BJT amplifier with an emitter inductor for high performance. The amplifier is stabilized by a collector inductor coupled in series between the collector of the transistor and the output and by a base inductor coupled between the input and the base of the transistor. The amplifier is further stabilized unconditionally for all frequencies by a stabilizing circuit coupled between the output and ground. The stabilizing circuit includes a stabilizing capacitor and a stabilizing resistor in series.

In one embodiment, a high frequency, low noise, narrowband amplifier is provided for amplifying a narrowband high frequency input signal that has a center frequency and a passband. The high frequency input signal is supplied to an amplifier input node, and following amplification, an amplified output signal is supplied from an amplifier output node. The low noise amplifier comprises a high frequency Bipolar Junction Transistor (BJT) that has a base, a collector, and an emitter. The BJT has a cut-off frequency that is at least two times greater than said center frequency. In some embodiments, the BJT may have a cut-off frequency in the range of four to ten times greater than said center frequency. The amplifier also includes an emitter inductor coupled between the emitter and ground, which is a shunt feedback element that improves the input impedance match and improves the noise figure. A base inductor is coupled between the amplifier input node and the base, and a collector inductor is coupled between the collector and the amplifier node. Both the base inductor and the collector inductor have inductances selected to stabilize out-of-band high frequency oscillations, and the base inductor and the collector inductor work together to create a broad band near open circuit at high frequencies. However, the value of these two inductors is small enough to maintain a narrowband response.

An output stabilizing circuit is coupled between the amplifier output node and ground. The stabilizing circuit includes a stabilizing capacitor in series with a stabilizing resistor. The output stabilizing circuit provides unconditional stability at all frequencies; i.e., it renders the amplifier stable for all combinations of terminating impedances at all frequencies.

An input impedance matching circuit may be coupled to the amplifier input node, and an output impedance matching circuit may be coupled to the amplifier output node. The output impedance matching circuit has a narrowband response, and includes a capacitor and an inductor coupled in shunt between the amplifier output node and ground. The output impedance matching circuit limits the bandwidth while matching the output impedance. Such an impedance matching circuit is useful for many commercial communications receivers.

The BJT amplifier can be coupled in a two-stage configuration to provide a two-stage high frequency low noise narrowband amplifier. The two-stage amplifier includes a first amplifier stage and a first stage stabilizing circuit including a first stabilizing resistor coupled to the output of the first amplifier stage. The two-stage amplifier further comprises a second stage amplifier circuit and a second stage stabilizing circuit coupled to the output of the second amplifier circuit, including a second stabilizing resistor and a stabilizing capacitor coupled in series between a two-stage amplifier output node and ground.

The features and advantages described in the specification are not all inclusive, and particularly, many additional features and advantages will be apparent to one of ordinary skill in the art in view of the drawings, specification and claims hereof. Moreover, it should be noted that the language used in the specification has been principally selected for readability and instructional purpose, and therefore resort to the claims is necessary to determine the inventive subject matter.

DETAILED DESCRIPTION OF THE PREFERRED EMBODIMENT

Figure 1:
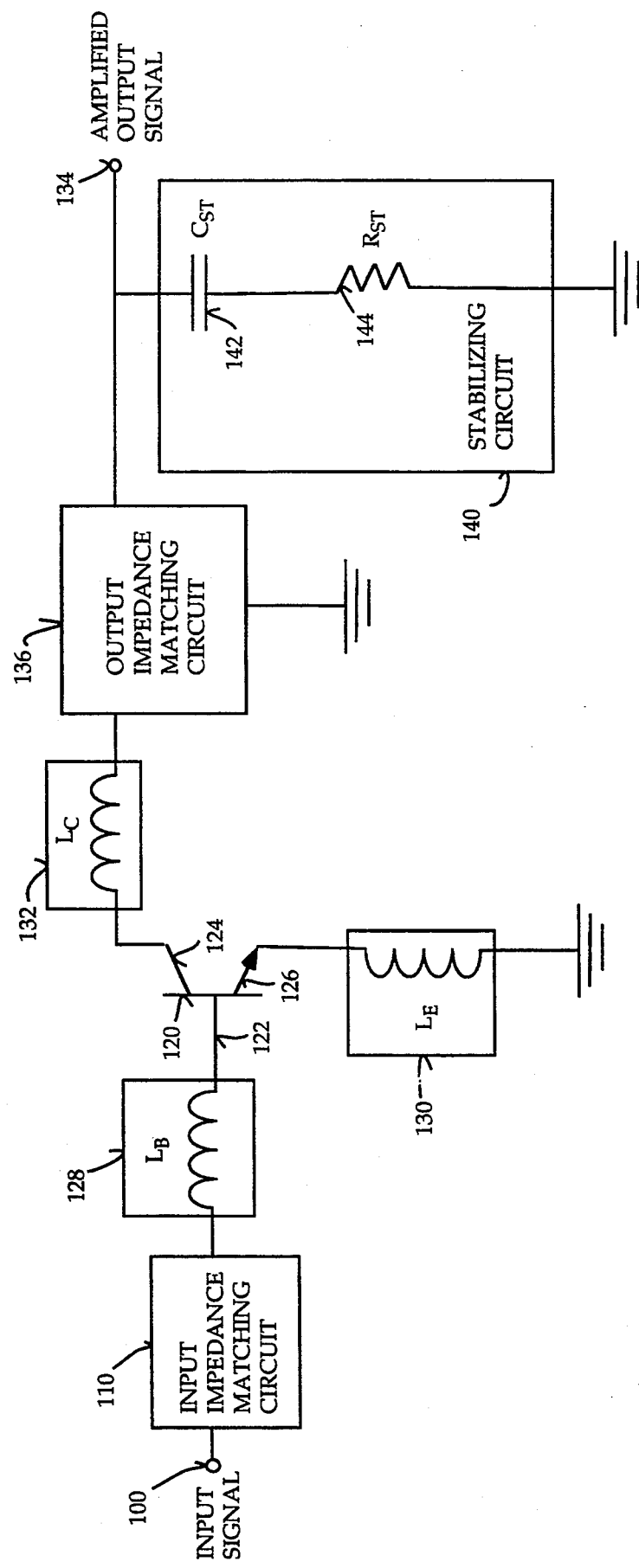
FIG. 1 is a diagram of a low noise narrowband high frequency amplifier illustrated with blocks and circuit components.
Figure 2:
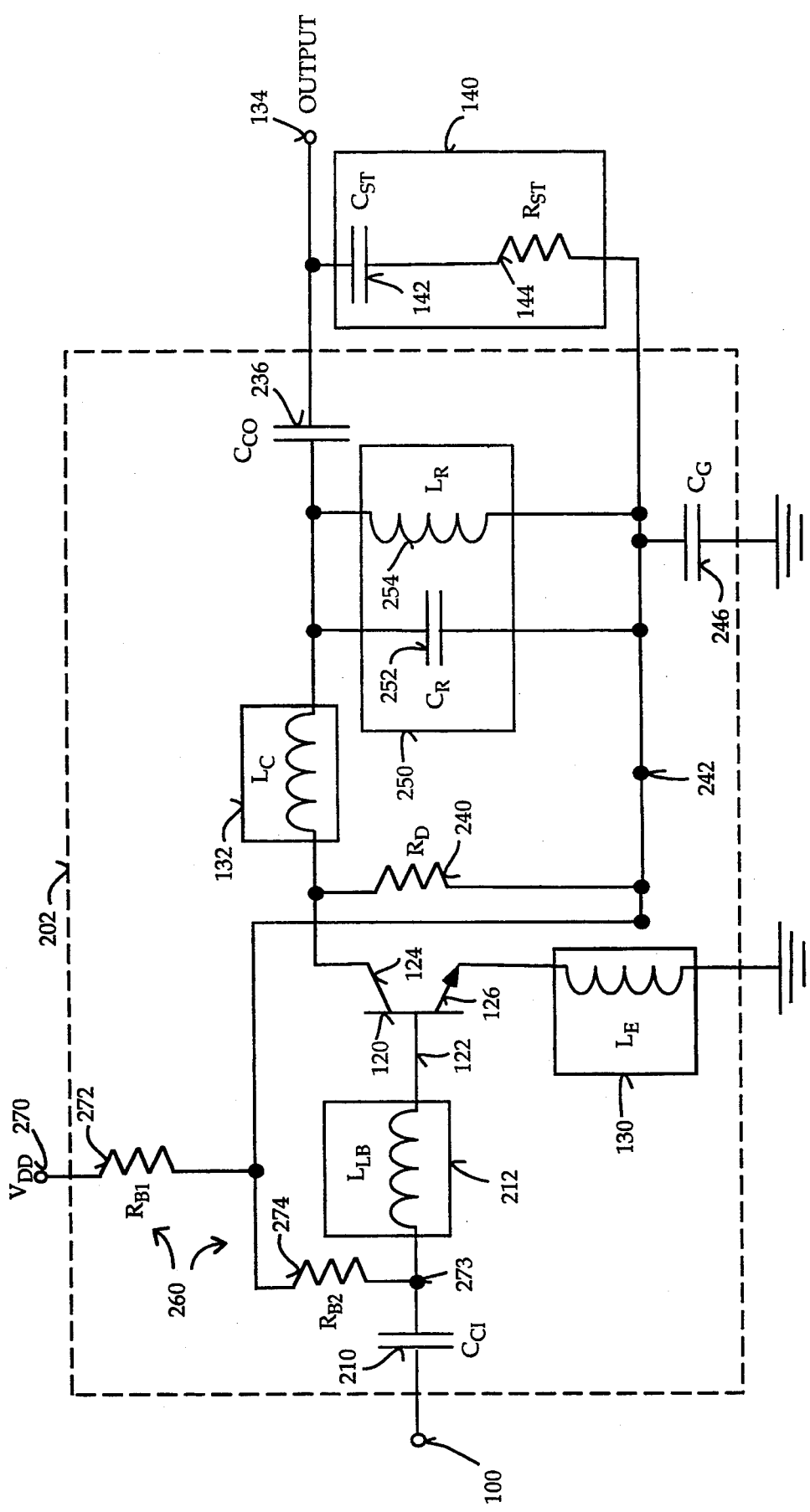
FIG. 2 is a circuit diagram of a low noise narrowband high frequency amplifier.
Figure 3:
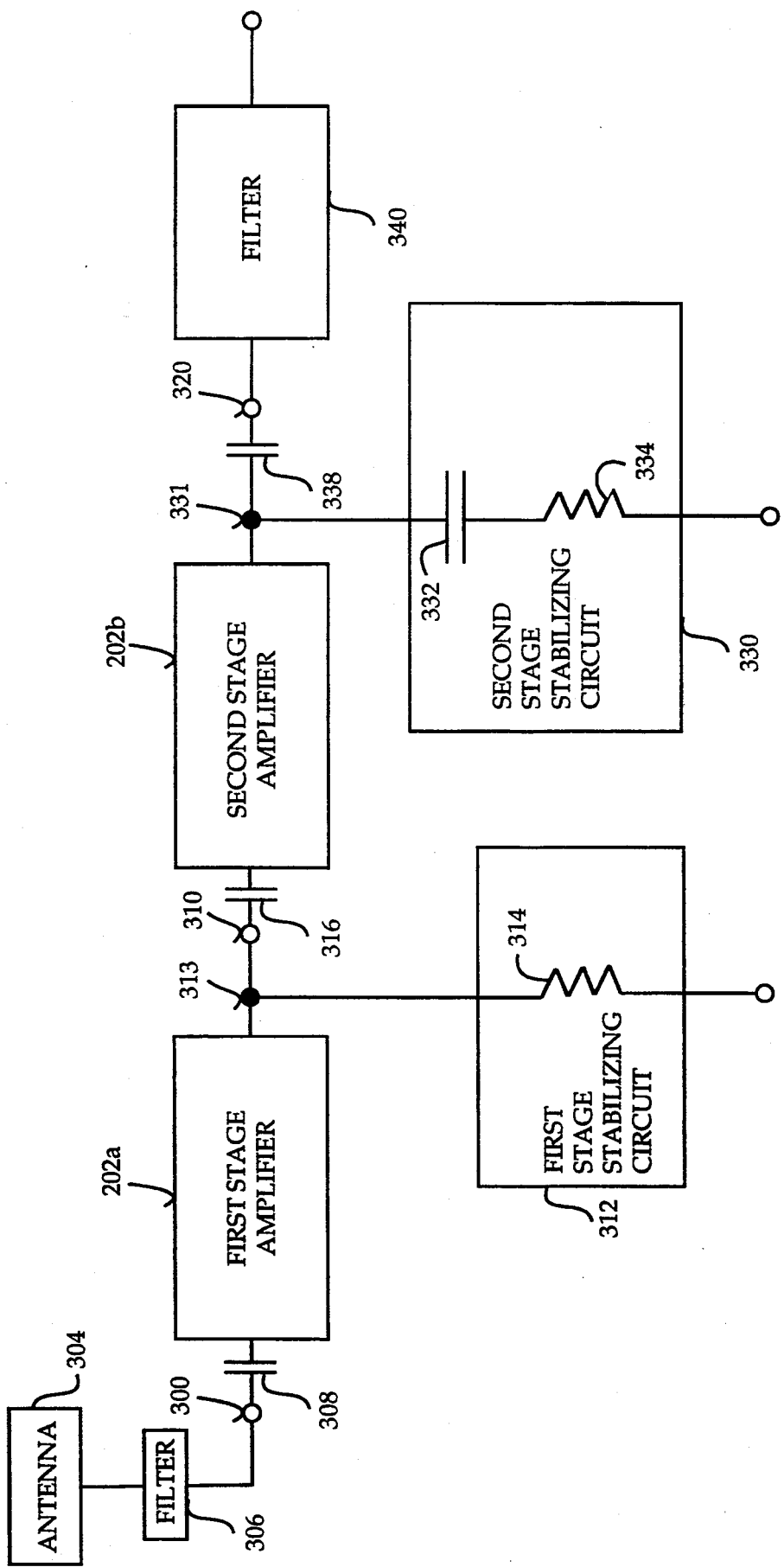
FIG. 3 is a diagram of a two-stage amplifier incorporating two low noise narrowband high frequency amplifiers.

FIGS. 1 through 3 of the drawings disclose various embodiments of the present invention for purposes of illustration only. One skilled in the art will readily recognize from the following discussion that alternative embodiments of the structures and methods illustrated herein may be employed without departing from the principles of the invention.

Reference is made to FIG. 1 which is a diagram of a low noise high frequency BJT amplifier illustrated with blocks and circuits elements. An input signal from any conventional source of high frequency signals is received on an input node 100 and applied to an input impedance matching circuit 110. The input node 100 can receive any of a plurality of inputs, including an input from an antenna, a direct feed from a coaxial cable, or any other suitable source. The input impedance matching circuit 110 matches the input impedance at the input 100 to the remainder of the circuit in accordance with conventional techniques. The circuit 110 may include circuit components—capacitors, resistors, and inductors—either in series or in shunt. For example, it may include a series inductor either alone or in parallel with a capacitor, or it may include a capacitor and an inductor shunted to ground. The circuit 110 may also include any coupling capacitors.

A bipolar junction transistor (BJT) 120 includes a base 122, a collector 124, and an emitter 126. The BJT 120 is preferably a high frequency BJT; in other words, it has a cut-off frequency that is at least two to three times, and preferably seven to eight times or more, that of the center frequency. A cut-off frequency is conventionally defined where the current gain equals approximately one. The BJT 120 is preferable over a field effect transistor (FET) because a suitable high frequency BJT transistor is readily available. Even if an FET were made available, it would likely have a higher cost, therefore still making the BJT 120 preferable.

A base inductor 128 having an inductance $L_B$ is coupled between the input impedance matching circuit 110 and the base 122. An emitter inductor 130 having an inductance $L_E$ is coupled between the emitter 126 and ground. A collector inductor 132 having an inductance $L_C$ is coupled to the collector 124. The collector inductor 132 is coupled to an output 134 via an output impedance matching circuit 136 that includes circuit components such as capacitors, resistors, or inductors necessary to match a desired output impedance. The output impedance matching circuit 136 may include, for example, a parallel inductor and capacitor coupled between the output and ground, or a series inductor either alone or in parallel with a capacitor.

During operation, the base inductor 128 and the collector inductor 132 together improve stability of the amplifier. Particularly, with an applied 50 input impedance and a 50Ω output impedance, the collector inductor 132 together with the base inductor 128 provide an amplifier circuit that prevents instability at frequencies greater than the second harmonic. In order to stabilize the circuit, the inductances $L_C$ and $L_B$ should be large enough to approximate open circuit conditions at frequencies above the second harmonic. Specifically, the collector inductance $L_C$ and the base inductance $L_B$ should be selected so that the K factor at frequencies greater than the second harmonic is greater than one, or is as close to one as possible. However, the inductance $L_C$ should not be large enough to cause a broadband response instead of a narrowband response; in other words, the inductance $L_C$ should be small enough to preserve the narrowband response. Furthermore, the inductance $L_C$ and the inductance $L_B$ should each be small enough that their self-resonance frequency exceeds the highest frequency at which a reasonable possibility of oscillation exists. In the preferred embodiment, the value of the inductance $L_C$ for passband frequencies in the 900 MHz range was determined through simulation to be about 2.7 nH.

A stabilizing circuit 140 is coupled between the output 134 and ground. The stabilizing circuit 140 includes a stabilizing capacitor 142 having a capacitance $C_{ST}$ in series with the stabilizing resistor 144 having a resistance of $R_{ST}$, shunted between the output 134 and ground. The capacitance $C_{ST}$ should be small enough to avoid adverse effects on performance in the desired passband, while at the same time being large enough to provide a low impedance for stability at higher frequencies. The resistance $R_{ST}$ should be chosen small enough to make the amplifier unconditionally stable, or equivalently to have a K factor greater than or equal to one for all frequencies greater than the second harmonic. The stabilizing resistor 144 preferably has a resistance $R_{ST}$ as large as possible in order to have a minimal effect on the response in the passband. For the preferred embodiment, the resistance $R_{ST}$ has been determined to be 500 ohms and the capacitance $C_{ST}$ has been determined to be 0.5 pF. The preferred embodiment was designed for an amplifier operating around 900 MHz: specifically for a pager at 931 MHz. However, it should be apparent to one skilled in the art that other components could be utilized to provide an amplifier for different frequencies.

Reference is made to FIG. 2 which is a circuit diagram of a high frequency amplifier 202 constructed in accordance with the principles of the present invention. The input node 100 receives a high frequency input signal. An input coupling capacitor 210 couples the high frequency signal from the input node 100 into the amplifier 202 through a lumped base inductor 212 having a lumped inductance $L_{LB}$ that includes the inductance $L_B$ of the base inductor 112 (FIG. 1), and an additional inductance ($L_{LB}-L_B$) for matching the input impedance. The lumped base inductor 212 is coupled to the base of the transistor 120, preferably a bipolar junction transistor (BJT), including a base 122, a collector 124, and an emitter 126.

The emitter inductor 130 having the inductance $L_E$ is coupled between the emitter 126 and ground. The collector inductor 132 having the inductance $L_C$ is coupled to the collector 124 of the transistor 120. The collector inductor 132 is coupled between the collector 124 and an output coupling capacitor 236 having a capacitance $C_{CO}$, which is coupled to the output node 134.

An in-band stabilizing resistor 240 with a resistance $R_D$ is coupled between the collector 124 and a common node 242. The resistance $R_D$ is selected to provide unconditional stability within the passband, in accordance with conventional techniques. In the preferred embodiment, the resistance $R_D$ equals 750Ω. A bypass capacitor 260 is coupled between the common node 242 and ground. A narrowband matching circuit 250 is coupled between the output side of the collector inductor 232 and the common node 242. The narrowband matching circuit 250 is useful for matching the output impedance at the output node 134. Furthermore, the narrowband matching circuit 250 assists in providing a narrowband response, but the resonant frequency of the matching circuit 250 will not necessarily be the same as that of the center frequency of the passband. The narrowband matching circuit 250 includes a capacitor 252 having a capacitance $C_R$ in shunt with an inductor 254 having an inductance $L_R$. Within the narrowband matching circuit 250, the capacitance $C_R$ of the capacitor 252 and the inductance $L_R$ of the inductor 254 are chosen to match the output impedance. The stabilizing circuit 140 is coupled between the output node 134 and the common node 242. The stabilizing circuit 140 provides stability for all terminating impedances at all frequencies.

A biasing circuit 260 for the transistor 220 includes a voltage source 270 that defines a voltage $V_{DD}$ with respect to ground, a first bias resistor 272 having a resistance $R_{B1}$ coupled between the voltage source 270 and the common node 242, and a second bias resistor 274 having a resistance $R_{B2}$ coupled between the common node 242 and an intermediate node 273 defined between the input coupling capacitor 210 and the base inductor 212. The resistance $R_{B1}$ and the resistance $R_{B2}$ are selected to bias the transistor 120. The biasing circuit 260 provides a specified bias voltage at both the collector 124 and the base 122.

Reference is now made to FIG. 3, which is a diagram of a two-stage amplifier circuit including two interconnected amplifiers illustrated in FIG. 2. An input node 300 receives a high frequency input signal from an external source, such as an antenna or a direct coaxial wire. In FIG. 3, an antenna 304 is illustrated to provide the high frequency input signal to the input node 300. The antenna 304 comprises any conventional antenna such as a microstrip antenna. Additional circuits, such as a filter 306, may also be utilized. The input node 300 is connected through an input coupling capacitor 308 to a first stage amplifier 202a that is constructed in accordance with the amplifier 202 illustrated in FIG. 2. The output of the first stage amplifier 202a is supplied to a first stage output node 310. A first stage stabilizing circuit 312 is coupled to a node 313 defined between the first stage output node 310 and the first stage amplifier 202a. Specifically, the first stage stabilizing circuit 312 is coupled between the node 313 and ground. The first stage stabilizing circuit 312 includes a first stabilizing resistor 314. By comparison with FIGS. 1 and 2, it may be noted that the first stage stabilizing circuit 312 (FIG. 3) omits the stabilizing capacitor 142 (FIGS. 1 and 2) illustrated in the stabilizing circuit 140. It was found that this capacitor 142 could be omitted in the first stage without substantially degrading performance.

The output node 310 of the first stage amplifier 202a is coupled through an intermediate coupling capacitor 316 to a second stage amplifier 202b which is constructed in accordance with the amplifier 202 illustrated in FIG. 2. The output of the second stage amplifier 202b is provided to a second stage output node 320. A second stage stabilizing circuit 330 is coupled to a node 331 between the second stage output node 320 and the second stage amplifier 202b. The second stage stabilizing circuit 330 includes a stabilizing capacitor 332 and a second stabilizing resistor 334. The second stage stabilizing circuit 330 is constructed in accordance with the stabilizing circuit 140 illustrated in FIGS. 1 and 2. The second stage output node 320 is coupled through an output coupling capacitor 338 to a conventional filter 340. An amplified, filtered output is thereby made available for further processing or for any other purpose.

Experimental results of the two-stage amplifier shown in FIG. 3 have verified its stability over all frequencies and all input and output terminating impedances. At an applied voltage $V_{DD}$ of 1.2 volts, the current was measured to be 1.2 mA, which translates to a power consumption of 1.4 mW. At 900 MHz, the measured gain was 16 dB, and the measured noise figure was 1.9 dB. The return loss at the input was better than $-10$ dB, and the return loss at the output was better than $-15$ dB.

From the above description, it will be apparent that the invention disclosed herein provides a novel and advantageous low noise amplifier with reduced power consumption. The foregoing discussion discloses and describes exemplary methods and embodiments of the present invention. As will be understood by those familiar with the art, the invention may be embodied in other specific forms without departing from its spirit or essential characteristics, and thus, the described embodiment is not restrictive of the scope of the invention. The following claims are indicative of the scope of the invention. All variations which come within the meaning and range of equivalency of the claims are to be embraced within their scope.

What is claimed is:

1. A low noise, narrowband amplifier for amplifying a narrowband high frequency input signal supplied to an amplifier input node, said signal having a center frequency and a passband, said amplifier supplying an amplified output signal from an amplifier output node, said low noise amplifier comprising:
    a high frequency bipolar junction transistor (BIT) having a base, a collector, and an emitter, said high frequency BIT having a cut-off frequency that is at least two times greater than said center frequency;
    an emitter inductor coupled between the emitter and ground;
    a base inductor coupled between the amplifier input node and the base, said base inductor having a base inductance selected for stabilizing out-of-band high frequency oscillations;
    a collector inductor coupled between the collector and the amplifier output node, said collector inductor having a collector inductance selected for stabilizing out-of-band high frequency oscillations wherein said base inductance and said collector inductance are selected to approximate an open circuit at frequencies above the second harmonic; and
    an in-band stabilizing resistor coupled between the collector and ground, said in-band stabilizing resistor having a resistance $R_D$ selected to unconditionally stabilize the amplifier at all frequencies within the passband.

2. A low noise, narrowband amplifier for amplifying a narrowband high frequency input signal supplied to an amplifier input node, said signal having a center frequency and a passband, said amplifier supplying an amplified output signal from an amplifier output node, said low noise amplifier comprising:
    a high frequency bipolar junction transistor (BIT) having a base, a collector, and an emitter, said high frequency BIT having a cut-off frequency that is at least two times greater than said center frequency:
    an emitter inductor coupled between the emitter and ground;
    a base inductor coupled between the amplifier input node and the base, said base inductor having a base inductance selected for stabilizing out-of-band high frequency oscillations;
    a collector inductor coupled between the collector and the amplifier output node, said collector inductor having a collector inductance selected for stabilizing out-of-band high frequency oscillations wherein said base inductance and said collector inductance are selected to approximate an open circuit at frequencies above the second harmonic; and
    a stabilizing circuit for stabilizing the amplifier at all frequencies above the second harmonic, said stabilizing circuit coupled in series between the amplifier output and ground, said stabilizing circuit including a stabilizing resistor.

3. The amplifier as claimed in claim 2 wherein said stabilizing circuit further includes a stabilizing capacitor in series with the stabilizing resistor.

4. The amplifier as claimed in claim 2 further comprising:
    an in-band stabilizing resistor coupled between the collector and ground having a resistance $R_D$ selected to unconditionally stabilize the amplifier at all frequencies within the passband;
    an input impedance matching circuit coupled between the amplifier input node and the base inductor; and
    an output impedance matching circuit coupled between the collector inductor and the amplifier output node.

5. The amplifier as claimed in claim 4 wherein said output impedance matching circuit includes a capacitor and an inductor coupled in shunt between the amplifier output node and ground.

6. The amplifier as claimed in claim 2, wherein said stabilizing resistor is chosen small enough that the amplifier has a K factor greater than or equal to one for all frequencies greater than the second harmonic, and large enough to reduce said stabilizing resistor's effect on the amplifier's passband response.

7. The amplifier as claimed in claim 3, wherein said stabilizing capacitor has a value large enough to provide a low impedance to improve stability at frequencies higher than the passband frequencies.

8. A low noise, narrowband amplifier for amplifying a narrowband input signal supplied to an amplifier input node, said input signal having a center frequency and a passband, said amplifier supplying an amplified output signal from an amplifier output node, said low noise amplifier comprising:
    a transistor having a control input, an output line, and a ground line, said transistor having a cut-off frequency at least twice the center frequency;
    a ground inductor coupled between the ground output of said transistor and ground;
    a second inductor coupled between the amplifier input node and the control input of the transistor;
    a third inductor coupled between the amplifier output node and the output line of the transistor; and
    a stabilizing circuit for stabilizing said amplifier at all frequencies above the second harmonic, said stabilizing circuit coupled between the amplifier output and ground, said stabilizing circuit including a stabilizing resistor.

9. The amplifier of claim 8 wherein said stabilizing circuit further includes a stabilizing capacitor in series with the stabilizing resistor.

10. The amplifier of claim 9 wherein said amplifier further comprises an in-band stabilizing resistor coupled between the output line and ground, said in-band stabilizing resistor having a resistance $R_D$ selected to unconditionally stabilize the amplifier at all frequencies within the passband.

11. The amplifier as claimed in claim 9, wherein said stabilizing capacitor has a value large enough to provide a low impedance to improve stability at frequencies higher than the passband frequencies.

12. The amplifier of claim 8 wherein said transistor comprises a Bipolar Junction Transistor (BJT).

13. The amplifier of claim 11 wherein said BJT has a cut-off frequency that is within a range between four and ten times greater than said center frequency.

14. The amplifier of claim 12 wherein said amplifier further comprises an in-band stabilizing resistor coupled between the collector and ground, said in-band stabilizing resistor having a resistance $R_D$ selected to unconditionally stabilize the amplifier at all frequencies within the passband.

15. The amplifier of claim 8 wherein said transistor comprises a Field Effect Transistor (FET).

16. The amplifier of claim 15 further comprising an output impedance matching circuit coupled between the amplifier output node and ground, said output impedance matching circuit having a narrowband frequency response.

17. The amplifier of claim 16 wherein said output impedance matching circuit includes a capacitor and an inductor coupled in shunt between the amplifier output node and ground.

18. The amplifier as claimed in claim 8, wherein said stabilizing resistor is chosen small enough that the amplifier has a K factor greater than or equal to one for all frequencies greater than the second harmonic, and large enough to reduce said stabilizing resistor's effect on the amplifier's passband response.

19. A high frequency, low noise, narrowband amplifier for amplifying a narrowband high frequency input signal supplied to an amplifier input node, said signal having a center frequency and a passband, said amplifier supplying an amplified output signal from an amplifier output node, said low noise amplifier comprising:
- a high frequency bipolar junction transistor (BJT) having a base, a collector, and an emitter, said high frequency BJT having a cut-off frequency that is greater than said center frequency;
- an emitter inductor coupled between the emitter and ground;
- a base inductor having a base inductance coupled to the base;
- a collector inductor having a collector inductance coupled to the collector
  wherein said base inductance and said collector inductance are selected to approximate an open circuit at frequencies above the second harmonic;
- an input impedance matching circuit coupled between the base inductor and the amplifier input node;
- an output impedance matching circuit having a narrowband frequency response coupled between the collector inductor and the amplifier output node; and
- an in-band stabilizing resistor coupled between the collector and ground, said in-band stabilizing resistor having a resistance $R_D$ selected to stabilize the amplifier at all frequencies within the passband.

20. The amplifier as claimed in claim 19 wherein said output impedance matching circuit includes a capacitor and an inductor coupled in shunt between the amplifier output node and ground.

21. The amplifier as claimed in claim 19 wherein said BJT has a cut-off frequency within a range between four and ten times the center frequency.

22. The amplifier as claimed in claim 19 further comprising a stabilizing circuit for stabilizing the amplifier at all frequencies above the second harmonic, said stabilizing circuit including a stabilizing resistor coupled between the amplifier output and ground.

23. The amplifier as claimed in claim 22 wherein said stabilizing circuit further includes a stabilizing capacitor in series with the stabilizing resistor.

24. The amplifier as claimed in claim 23, wherein said stabilizing capacitor has a value large enough to provide a low impedance to improve stability at frequencies higher than the passband frequencies.

25. The amplifier as claimed in claim 22, wherein said stabilizing resistor is chosen small enough that the amplifier has a K factor greater than or equal to one for all frequencies greater than the second harmonic, and large enough to reduce said stabilizing resistor's effect on the amplifier's passband response.

26. The amplifier as claimed in claim 19 wherein said output impedance matching circuit includes a fourth inductor coupled in series between the collector inductor and the amplifier output node.

27. The amplifier as claimed in claim 26 wherein said output impedance matching circuit further includes a capacitor in parallel with the fourth inductor.

28. The amplifier of claim 19 wherein the input impedance matching circuit includes a fourth inductor coupled between the amplifier input node and the base inductor.

29. The amplifier of claim 28 wherein said input impedance matching circuit further includes a capacitor coupled in parallel with the fourth inductor.

30. The amplifier as claimed in claim 19 wherein said input impedance matching circuit includes a fourth inductor coupled in parallel with a capacitor shunted between the amplifier input node and ground.

31. A two-stage, low noise, narrowband amplifier for amplifying a high frequency input signal received at a signal input node, said input signal having a center frequency and a passband, said two-stage amplifier supplying a two-stage amplifier output signal from a two-stage amplifier output node, said two-stage amplifier comprising:
- a first amplifier stage coupled to receive the signal input at a first amplifier input node, and output a signal from a first amplifier output node, including
  a first high frequency bipolar junction transistor (BJT) having a first base, a first collector, and a first emitter, said high frequency BJT having a cut-off frequency that is at least two times greater than said center frequency,
  a first emitter inductor coupled between the first emitter and ground,
  a first base inductor coupled between the first amplifier input node and the first base, said first base inductor having a base inductance selected for stabilizing out-of-band high frequency oscillations, and
  a first collector inductor coupled between the first collector and the first amplifier output node, said first collector inductor having a collector inductance selected for stabilizing out-of-band high frequency oscillations;
- a first stage stabilizing circuit for stabilizing said first amplifier stage for frequencies greater than the second harmonic, said first stage stabilizing circuit including a first stabilizing resistor coupled between the first amplifier output node and ground;
- a second stage amplifier circuit coupled to receive an input signal at a second amplifier input node from the first amplifier output node including
  a second high frequency bipolar junction transistor (BJT) having a second base, a second collector, and a second emitter, said high frequency BJT having a cut-off frequency that is at least two times greater than said center frequency,
  a second emitter inductor coupled between the second emitter and ground, a second base inductor coupled between the second amplifier input node and the base, said second base inductor having a base inductance selected for stabilizing out-of-band high frequency oscillations, and a second collector inductor coupled between the second collector and the two-stage amplifier output node, said second collector inductor having a collector inductance selected for stabilizing out-of-band high frequency oscillations; and a second stage stabilizing circuit for stabilizing said second amplifier stage at all frequencies above the second harmonic, said second stage stabilizing circuit including a second stabilizing resistor and a stabilizing capacitor coupled in series between the two-stage amplifier output node and ground.

32. The two-stage amplifier as claimed in claim 31 wherein the first BJT has a cut-off frequency that is within the range of four to ten times the center frequency, and further, wherein said second BJT has a cut-off frequency within the range of four to ten times the center frequency.

33. The two-stage amplifier as claimed in claim 31 wherein said first amplifier stage further includes a first output impedance matching circuit having a narrowband frequency response coupled between the first collector inductor and the first amplifier output node, and wherein the second stage amplifier circuit further includes a second output impedance matching circuit having a narrowband frequency response coupled between the second collector inductor and the second amplifier output node.

34. The two-stage amplifier as claimed in claim 33, wherein said first amplifier stage further includes a first in-band stabilizing resistor coupled between the first collector and ground for stabilizing said first amplifier stage at all frequencies within the passband, and wherein the second stage amplifier circuit further comprises a second in-band stabilizing resistor coupled between the second collector and ground for stabilizing said second amplifier stage at all frequencies with the passband.

35. The two-stage amplifier as claimed in claim 34 wherein said first output impedance matching circuit includes a capacitor and an inductor coupled in shunt between the first amplifier output node and ground, and wherein said second output impedance matching circuit includes a capacitor and an inductor coupled in shunt between the second amplifier output node and ground.

36. The two stage amplifier of claim 35, further comprising:
a first coupling capacitor coupled between the first stage amplifier input node and the first stage amplifier;
an intermediate coupling capacitor coupled between the first stage amplifier and the second stage amplifier; and
an output coupling capacitor coupled between the second stage amplifier and the two-stage amplifier output node.

37. The two-stage amplifier of claim 36, further comprising a biasing circuit including:
a first node coupling between said first in-band stabilizing resistor and ground, and between said first output impedance matching circuit and ground;
a first output coupling capacitor coupled between said first node and ground;
a second node defined between said second in-band stabilizing resistor and ground, and between said second output impedance matching circuit and ground;
a second output coupling capacitor coupled between said second node and ground;
a voltage source providing a bias voltage;
a first biasing resistor coupled between said voltage source and said first node for biasing said first BJT;
a second biasing resistor coupled between said voltage source and said second node;
a third biasing resistor coupled between said first node and a node between said first input coupling capacitor and said first base inductor; and
a fourth biasing resistor coupled between said second node and a node between said intermediate coupling capacitor and said second base inductor.

38. A low noise, narrowband amplifier for amplifying a narrowband high frequency input signal supplied to an amplifier input node, said signal having a center frequency and a passband, said amplifier supplying an amplified output signal from an amplifier output node, said low noise amplifier comprising:
a high frequency bipolar junction transistor (BIT) having a base, a collector, and an emitter, said high frequency BIT having a cut-off frequency that is at least two times greater than said center frequency;
an emitter inductor coupled between the emitter and ground;
a base inductor coupled between the amplifier input node and the base, said base inductor having a base inductance selected for stabilizing out-of-band high frequency oscillations;
a collector inductor coupled between the collector and the amplifier output node, said collector inductor having a collector inductance selected for stabilizing out-of-band high frequency oscillations wherein said base inductance and said collector inductance are selected to approximate an open circuit at frequencies above the second harmonic; and
wherein said collector inductance and base inductance are selected so that the K factor at frequencies greater than the second harmonic is greater than one, and the collector inductance is small enough to substantially preserve the narrowband response of the amplifier.

* * * * *